United States Patent [19]
Jassowski

[11] Patent Number: 5,768,146
[45] Date of Patent: Jun. 16, 1998

[54] METHOD OF CELL CONTOURING TO INCREASE DEVICE DENSITY

[75] Inventor: Michael Jassowski, Shingle Springs, Calif.

[73] Assignee: Intel Corporation, Santa Clara, Calif.

[21] Appl. No.: 412,291

[22] Filed: Mar. 28, 1995

Related U.S. Application Data

[62] Division of Ser. No. 349,308, Mar. 28, 1995, abandoned.

[51] Int. Cl.⁶ .................................................. G06F 15/00
[52] U.S. Cl. .................. 364/491; 364/488; 364/489; 364/490; 257/202; 257/208; 326/41
[58] Field of Search .................. 364/488, 489, 364/490, 491, 578; 257/202–208, 370, 362, 497, 923, 210, 211; 326/21, 41, 50

[56] References Cited

U.S. PATENT DOCUMENTS

| | | | |
|---|---|---|---|
| 4,484,292 | 11/1984 | Hong et al. | 364/491 |
| 4,577,276 | 3/1986 | Dunlop et al. | 364/488 |
| 4,581,306 | 4/1986 | Hasenauer et al. | 429/123 |
| 4,593,351 | 6/1986 | Hong et al. | 395/800 |
| 4,613,941 | 9/1986 | Smith et al. | 364/490 |
| 4,701,778 | 10/1987 | Aneha et al. | 357/45 |
| 4,811,073 | 3/1989 | Kitamura et al. | 257/203 |
| 4,811,237 | 3/1989 | Putatunda et al. | 364/491 |
| 4,849,904 | 7/1989 | Aipperspach et al. | 364/489 |
| 4,965,651 | 10/1990 | Wagner | 357/42 |
| 5,038,192 | 8/1991 | Bonneau et al. | 257/206 |
| 5,051,917 | 9/1991 | Gould et al. | 364/489 |
| 5,063,430 | 11/1991 | Mori | 357/45 |
| 5,095,356 | 3/1992 | Ando et al. | 357/45 |
| 5,165,086 | 11/1992 | Kamejima et al. | 364/491 |
| 5,175,693 | 12/1992 | Kurosawa et al. | 364/491 |
| 5,220,490 | 6/1993 | Weigler et al. | 257/700 |
| 5,225,720 | 7/1993 | Kondoh et al. | 307/465 |
| 5,225,991 | 7/1993 | Dougherty | 364/491 |
| 5,229,629 | 7/1993 | Koike | 257/211 |
| 5,309,371 | 5/1994 | Shikata et al. | 364/491 |
| 5,365,103 | 11/1994 | Brown et al. | 257/497 |
| 5,369,595 | 11/1994 | Gould et al. | 364/489 |
| 5,381,343 | 1/1995 | Bamji et al. | 364/488 |
| 5,384,472 | 1/1995 | Yin | 257/206 |
| 5,387,810 | 2/1995 | Seta et al. | 257/370 |
| 5,388,055 | 2/1995 | Tanizawa et al. | 364/491 |
| 5,404,033 | 4/1995 | Wong et al. | 257/202 |
| 5,477,467 | 12/1995 | Rugg | 364/490 |
| 5,483,461 | 1/1996 | Lee et al. | 364/490 |
| 5,532,501 | 7/1996 | Nakamura | 257/208 |

OTHER PUBLICATIONS

Yang et al "HALO: An efficient global placement strategy for standard cells" 1992 IEEE.

Shahookar et al "A genetic approach to standard cell placement using metagenetic parameter optimization" 1990 IEEE.

Moon et al "Compacting dead space in partitioning methods for random cells placements" 1991 IEEE.

Yang et al "HALO: an efficient global placement strategy for standard cells" 1990 IEEE.

Kuznar et al "An algorithm for placement of standard cells in integrated circuit" 1991 IEEE.

Kim et al "High performance CMOS macromodule layout synthesis".

Bhingarde et al "Over-the-cell routing algorithms for industrial cell models" Jan. 1994.

*Primary Examiner*—Jacques H. Louis-Jacques
*Attorney, Agent, or Firm*—Blakely. Sokoloff. Taylor & Zafman

[57] ABSTRACT

A layout arrangement which provides a contouring of cells that allows the individual rectangular cell boundaries to overlap each other to a point at which individual device edges abut one another thereby utilizing die area which is normally lost to use. In order to attain this result, a new cell contour boundary is described about each cell at the edge of each individual device adjacent the exterior of the cell at a distance at which other cells may abut without disturbing the operation of the cell. Then, computer implemented processes are applied to cause the cells to fit abutting the newly described boundaries.

8 Claims, 3 Drawing Sheets

METHOD OF CELL CONTOURING TO INCREASE DEVICE DENSITY

This is a divisional of application Ser. No. 08/349,308, filed Mar. 28, 1995, now abandoned.

BACKGROUND OF THE INVENTION

1. Field of the Invention

This invention relates to circuitry for digital systems such as computers, and more particularly, to improved layout designs for complimentary metal-oxide-silicon (CMOS) circuitry and methods of laying out devices based on those designs.

2. History of the Prior Art

A very important part of the design and manufacture of digital systems such as computers, consists of designing the layout of the circuitry used to accomplish the various operations performed by the circuitry. Layout design becomes increasingly more important as the size of the circuits involved decreases. With present technology, the manner in which circuits are laid out, the manner in which the connections to the devices of those circuits are routed, and the overall layout of a system including those circuits are extremely important to the success of the part. For example, the number of devices which may be placed in a particular area on a chip of semiconductor material depends on the positioning of the devices and the manner in which power is furnished to the devices. In many case, the ability to put more devices in a particular area of a chip makes particular circuitry feasible. On the other hand, even though a large number of devices may be placed in a particular area and receive power, those devices must also have all of the internal connections necessary for operation. Often the layout restricts the ability to furnish both internal and external connections and therefore makes tight packing of the individual devices impossible.

In order to make the best use of semiconductor die space, semiconductor circuits are typically assembled using circuits designed as standard cells. Standard cells are logic and other circuits (referred to as cells hereinafter) used by designers to construct central processing units (CPUs), application specific integrated circuits (ASICs), and other circuits. These CPUs, ASICs, and other larger circuits typically use well known forms of logic and other circuits in order to implement the details by which they carry out their larger functions. The standard cell circuits might be master-slave latches, NAND gates, NOR gates, or similar circuits. Typically, a large number of standard cells are designed, laid out, and placed in a software library of standard cells. There may be as many as one thousand different standard cell types in a particular software library for a particular manufacturing process.

When a standard cell is designed, special attention is paid to its layout so that it makes optimum use of die space. Consequently, a circuit designer will attempt to design circuitry utilizing standard cells to the greatest degree possible whenever designing larger circuits because the layout of these standard cells has already been optimized. The circuit designer decides which standard cells should be used to implement particular functions in the larger circuits he is designing and then utilizes a standard cell library to construct these larger circuits by replicating the standard cells as often as required by the circuitry, positioning the standard cells and other circuits on the design layout, and then providing the appropriate interconnections between the standard cells and other circuit elements. In this way, a larger circuit is produced in large part from individual standard cells each of which has already been designed and arranged in a manner making the best use of the particular technology being utilized.

As the abilities of semiconductor circuits grow larger and the size of such circuits grows smaller, it is very advantageous and economically necessary to provide more and more circuitry on each semiconductor chip. Although the layout of individual standard cells has been planned as well as is possible using the currently available technology, circuit designers often find that there still insufficient area on a semiconductor chip for the circuitry desired. Since standard cells take up a great portion of each larger circuit, the sizes of the individual standard cells and the ability to place large numbers of such standard cells on a chip limit the ability of a circuit designer to build larger circuits on a chip. In order to place more cells on a chip, designers of standard cells try to design standard cells which fit within the smallest space possible and which fit closely to one another. In order to fit closely to one another, standard cells have been designed to have a rectangular outline so that they may be placed adjacent other standard cells aligned in a row to use the same power supply conductors and may be abutted against other standard cells above and below which lie in rows defined by other power supply conductors.

The size of the rectangle including the devices of each standard cell is constrained by the size of the devices in the cell. As much as possible, designers of standard cells try to design a cell so that it includes either smaller transistor devices or larger power transistor devices. In this manner the density of the layout of a larger circuit may be optimized by providing rows which include only cells of the smaller devices having a smaller rectangular outline and other rows of cells of larger devices having a larger rectangular outline. However, a great number of standard cells comprise both a number of relatively small transistor devices arranged to provide an input stage for the cells and to carry out the logic functions of the cells, and one or more larger higher power transistor devices arranged to provide an output stage for the cell. The smaller transistor devices and the larger transistor devices do not utilize the same die areas and, consequently, have different outlines. In general, the size of the larger devices has been the limiting factor in determining the rectangular area required by each cell because the layout of these cells is arranged to fit within a rectangle the dimensions of which are typically determined by the outlines of the larger devices. Since a great many of these standard cells each of which includes both sizes of devices (hybrid size cells) must be used in designing larger circuits, the rectangular size of these hybrid size cells has become the factor which determines how close the rows of cells may be arranged on a chip. Since the layout of these hybrid size cells is arranged to fit within a rectangle the dimensions of which are determined by the outlines of the larger devices, this often means that space around smaller devices is wasted.

It is very desirable to provide a new layout and a method for realizing that layout for semiconductor circuits which allows a more dense layout of standard cells and other circuitry on semiconductor chips. It is also desirable to provide layouts for standard cells which allows density optimization utilizing standard cells that include transistor devices having both large and small outlines. Moreover, it is especially desirable to provide layouts for standard cells which allows maximum utilization of standard cells including individual transistor devices with both large and small outlines.

SUMMARY OF THE INVENTION

The objects of the present invention are realized in a layout arrangement which provides a contouring of cells that allows the boundaries of individual rectangular cell to overlap each other to a point at which individual device edges abut one another thereby utilizing die area which is normally lost to use. In order to attain this result, a new cell contour boundary is described about each cell at the edge of each individual device adjacent the exterior of the cell at a distance at which other cells may abut without disturbing the operation of the cell. Then, computer implemented processes are applied to cause the cells to fit abutting the newly described boundaries.

This and other objects and features of the invention will be better understood by reference to the detailed description which follows taken together with the drawings in which like elements are referred to by like designations throughout the several views.

DETAILED DESCRIPTION

Figure 1:
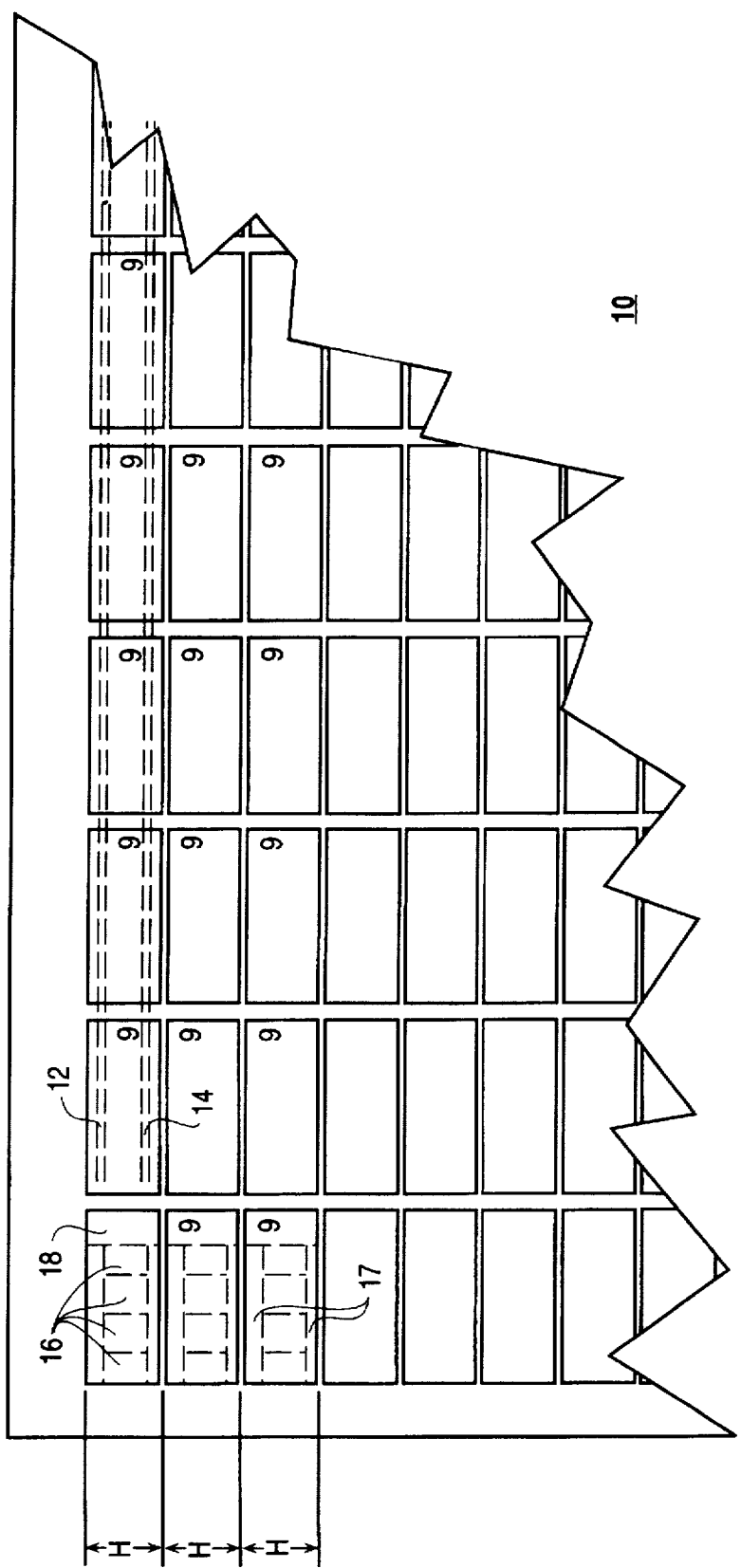
FIG. 1 is a diagram illustrating the layout of standard cells in a semiconductor chip designed in accordance with the prior art.

Referring now to FIG. 1, there is illustrated an arrangement of standard cells 9 on a semiconductor chip 10. The chip 10 may be designed in accordance with a number of well known processes which place individual non-standard semiconductor circuits and standard cells comprised of individual semiconductor devices such as transistors in standard circuit arrangements such as AND gates, OR gates, latches, and the like on a semiconductor die. These standard circuit arrangements which are called standard cells are designed to be utilized to provide a number of particular functions necessary in implementing larger circuits such as CPUs and ASICs. Standard cells are used repeatedly in larger circuits. Therefore, the design of standard cells optimally arranges the devices of each cell in the smallest area possible given the need for internal and external conductors generally represented by the metallic layers of the semiconductor chip.

A library of standard cells provides a large number of different ones of these standard cells in software. When a larger circuit is designed using these standard cells, the individual standard cells are replicated as often as necessary to carry out the functions of the larger circuit. The replicated standard cells are laid out on a semiconductor die in horizontal rows (as seen in the figure) on the layout of what will be the semiconductor chip. The positions of these rows are essentially defined by the separation of large metallic power buses 12 and 14 positioned parallel to one another over the face of the chip. Such metallic conductors are typically a part of the first metallic layer (referred to as metal 1) of conductors on the chip. These buses are the large current carriers used to apply power directly to the individual devices within the cells in a row on the semiconductor chip. These buses are the part of a metallic grid of power connections which furnish power to all of the cells on the chip. All such cells in a horizontal row must fit within a fixed height H (shown in the figure) of a row. This height H is typically determined by the height of the largest cell in the row, generally a cell providing a power transistor output stage. The dimension of this largest cell in a row influences the spacing of the conductors carrying the voltages Vcc and Vss for the associated cells. Typically, one of these conductors 12 may be positioned at the top of the row to provide the voltage Vcc to all of the devices in each cell of the row and the other conductor 14 may be positioned at the bottom of the row to provide the voltage Vss to all of the devices in each cell of the row (see FIG. 2 which illustrates an exemplary cell). The individual cells in each row are each aligned to utilize these power buses so that the power buses lie within but near to the typical cell boundaries. Once the standard cells and all other portions of the larger circuit have been laid out, connections are provided between the individual cells and other circuit elements.

Although the height of a standard cell is typically determined by the height of its largest transistor device, many smaller transistor devices are usually included in each cell. In the prior art, the individual standard cells have been rectangular. Since many cells utilize both P type and N type transistor devices, it is typical to position the smaller ones of the N type devices in a cell just below the conductor 12 at the top of the row and the smaller ones of the P type devices at the bottom of the row just above the conductor 14 of that row. In some cases, the patterns of cells in adjoining rows may be reversed so that the cells of the adjoining rows may utilize the same power buses. Thus, the bus carrying Vss at the bottom edge of an upper row may provide Vss to the cells at the top edge of a next lower row; and the bus carrying Vcc at the bottom of the next lower row may provide Vcc to the cells at the top edge of yet a next lower row. However, in such a case, the total width of the conductors 12 and 14 must be twice that of a single conductor in order to carry the extra current necessary for the two adjacent rows.

The larger the height H, the smaller the number of standard cells 9 which may be placed on a semiconductor chip 10. The smaller the height H, the larger the number of cells 9 which may be placed on the semiconductor chip. The individual transistor devices within these cells, however, can only be made to have a certain minimum size until they must be made wider; widening typically reduces the efficiency of the devices and ultimately requires more overall die area.

As has been pointed out, many standard cells 9 include a plurality of relatively small transistor devices 16 arranged both to provide input to the cells and to carry out the logical functions of the cells, and one or more larger transistor devices 18 arranged to provide the output stages for the cells. The smaller transistor devices and the larger power transistor devices do not utilize the same die areas and, consequently, have different external outlines. This effect is shown generally in FIG. 1 and may be seen in detail in FIG. 2 which shows a representative standard cell. In general, the size of the power carrying output transistor devices has been the limiting factor in determining the die area required by each cell and therefore how close the cells may be arranged on a chip. Thus, in the prior art, cells have had a rectangular outline and have been placed in rows the height H of which is determined by the height of the largest device in the cell. As may be seen in the standard cells 9 pictured in FIG. 1, the arrangement of devices 16 and the larger devices 18 leaves die areas (e.g., area 17) within the individual cells 9 which are not utilized. This limits how close the standard cells may be placed on any particular semiconductor chip. In other standard cells, because of the difference in device sizes or other reasons the edges of the individual devices often leave similar unused areas 17. Of course, it will be recognized that the same limitation applies to any large integrated semiconductor circuit which utilizes logically independent cells which may be placed in various positions to optimize the use of the die area.

Figure 2:
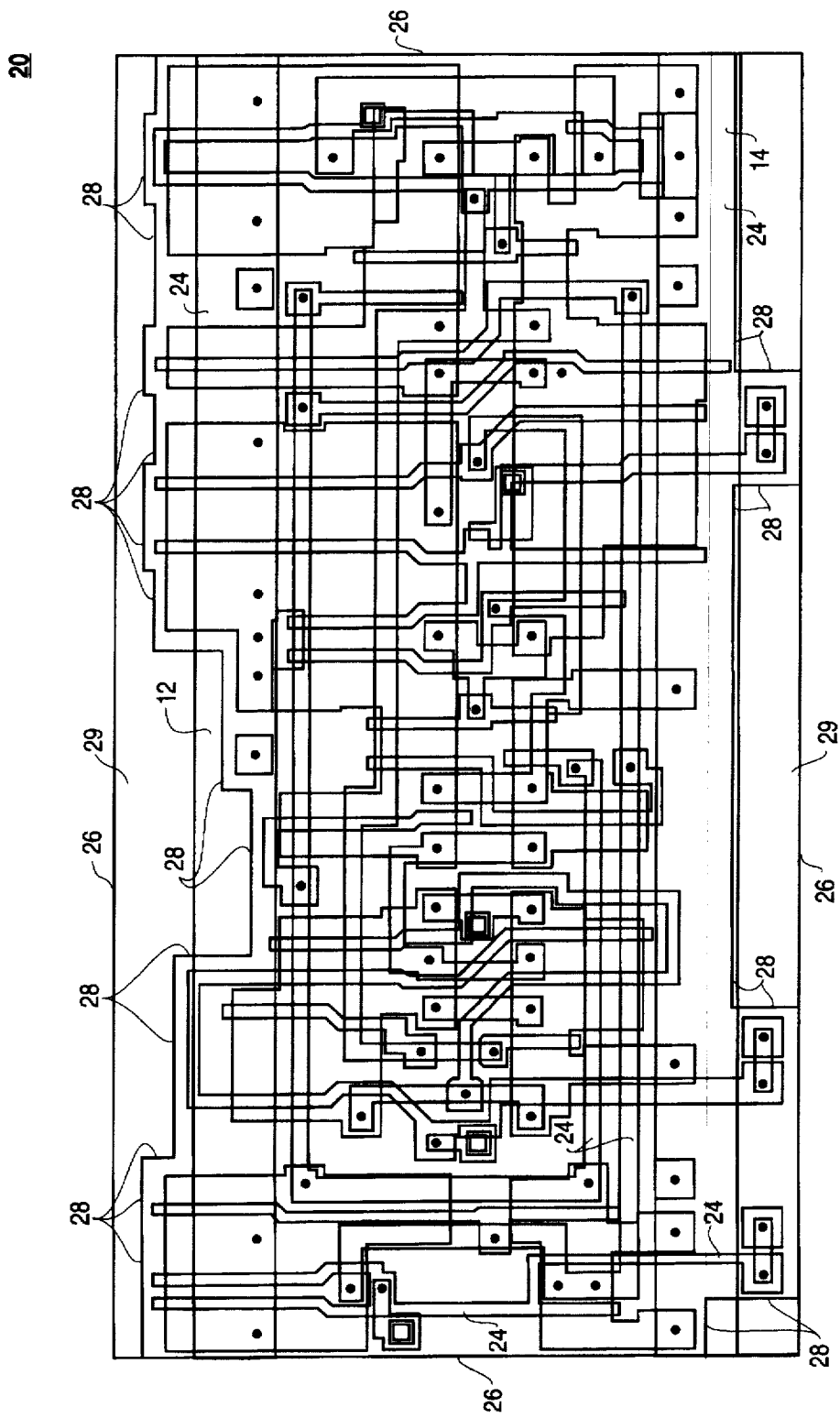
FIG. 2 is a diagram illustrating the layout of a single standard cell in a semiconductor chip designed in accordance with the present invention.

FIG. 2 illustrates a standard cell 20 which is designed as a master-slave latch. The cell 20 is designed to include a silicon substrate into which a number of individual devices have been diffused and interconnected. For the purposes of the present invention, the outline of the limits of diffusion for each of the individual devices is illustrated in the FIG. 2. Both metal 1 and polysilicon conductive interconnections 24 between various elements of the individual devices are illustrated. Spaced apart and parallel to one another at opposite sides of the cell 20 are metal 1 conductors 12 and 14 which provide busing for voltages Vcc and Vss. Various contacts and vias interconnecting the various conductive elements are also illustrated but are not pertinent to the present invention. Not shown in FIG. 2 are the various metal conductive layers which are deposited on top of the metal 1 layers and which are generally utilized to interconnect the different cells to one another.

Around the outside of the cell 20 is a rectangular boundary 26. This boundary 26 is used by prior art practitioners in placing cells on a chip in the manner illustrated in FIG. 1. Essentially, the edges of the four sides of rectangular boundary 26 for each cell are placed as close as desired to the edges of the rectangular boundaries 26 of four other adjacent cells. The strips 12 and 14 of the cells are aligned so that they continue through all of the cells in a row.

In FIG. 2, a contour line 28 has been drawn which is as close as possible on the die to each individual device on the cell 20. This contour line 28 approaches each diffusion area and each conductive element to a distance as close as is typically possible without causing an effect on the element or area. Thus, another conductive element or diffusion area could be placed on the underlying silicon up to this contour line 28 (presuming an appropriate protective distance is also allowed for the new element) without affecting the operation of the devices on the cell 20. As may be seen, the area 29 on the die between the rectangular boundary typically used to place cells on the substrate and the contour line 28 is substantial. This area 29 is wasted when cells are aligned on the substrate in the manner of the prior art.

The present invention utilizes the contour lines 28 described for each of the standard cells as boundaries to place the cells with relation to one another on the silicon substrate. Contour lines (or boundaries) 28 are drawn for each of the standard cells in the standard cell library. In general, each element of each device in a cell must be kept a prescribed distance from each other element of each other device in the cell. Thus, each polysilicon element must be kept a specified distance from each other element in a particular manufacturing process; each diffused element must be kept a particular distance from any adjacent element in a particular manufacturing process. These distances are well known to those skilled in the art. For example, a polysilicon element may need to be positioned at least one-half the width of the element from any other element. These distances determine the boundaries of the contour lines for each device. When these distances at the exterior of the individual devices and elements are joined, they determine the overall contour or boundary line for each individual standard cell. Joining these distances determines a boundary surrounding each standard cell to which circuit devices may approach without significantly disturbing the operation characteristics of the standard cell. As may be seen, the outline provided by this new boundary line around the typical standard cell is no longer rectangular although it is generally rectilinear. This is especially true along the cell edges which run generally parallel to busing conductors 12 and 14. Once the contour lines are determined for all of the cells, they are placed with the cell in the library.

When a larger circuit is laid out, the standard cells are positioned in rows defined by the busing conductors typically using software techniques well known in the art. Then the cells are adjusted into positions by a software program such that the contours of cells in adjacent rows are caused to fit closest together. The closest the rows may be brought together is thus a position in which the busing conductors carrying the voltages Vcc and Vss do not touch if lying adjacent one another. However, if the cells of alternate rows are reversed, then only a single though wider busing conductor carrying either Vcc or Vss is required to furnish power to each of an upper and lower row of cells, and these busing conductors may be positioned essentially separating the rows without overlapping since their overall size cannot be reduced without limiting their current carrying capacity. Thus, the rows may be brought as close as is possible without causing the contour lines or the busing conductors of adjacent cells to overlap. Once this has been accomplished, the external conductors are placed in positions to make connections between the standard cells and other circuits components.

Figure 3:
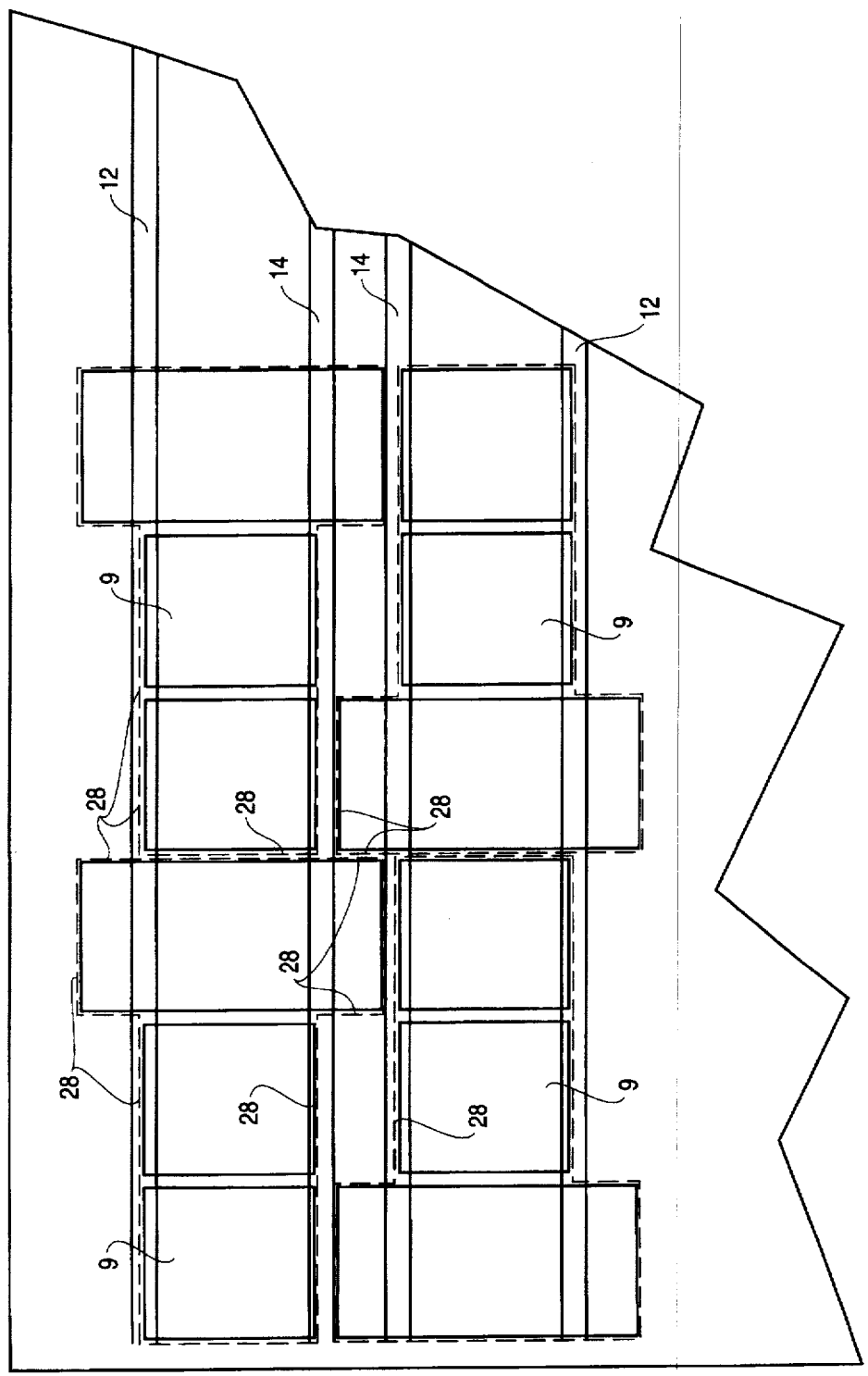
FIG. 3 is a diagram illustrating the layout of standard cells in a semiconductor chip designed in accordance with the present invention.

FIG. 3 illustrates four adjacent standard cells positioned in accordance with the present invention. As may be seen, where one cell is lower along its upper contour line, a cell with a protruding lower contour line may fit. By adjusting the placement, it is possible to save from five to twenty percent of the total die area on the semiconductor.

In order to accomplish the placement of cells on the substrate, any of a number of software packages are commercially available. In one embodiment of the invention, a software package named "Cell3 Ensemble" manufactured by Cadence Software was utilized. This software includes a first process which includes an algorithm called "Q Place" for aligning the cells of each row to the adjoining rows along their rectangular boundaries. This process is first used and causes the cells to be aligned in the manner illustrated in FIG. 1. A second software process named "Classic Place" of the package provides an algorithm for moving the rows together at the top and bottom. Heretofore, this algorithm has been used only with rectangular boundaries. However, the algorithm may be made to cause the rectangular boundaries of cells in a row to overlap the rectangular boundaries of cells in adjacent rows up to defined positions. In this process, the contour lines 28 are used as the defined positions. Running these two processes causes the standard cells to be aligned and placed in the manner shown in FIG. 3 to make much better use of the die area of the silicon substrate.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer implemented method for positioning standard cells on a semiconductor substrate comprising the steps of:

determining a minimum boundary surrounding each standard cell to which circuit devices may approach without significantly disturbing the operation characteristics of the standard cell;

positioning the standard cells in substantially parallel rows on the semiconductor substrate as defined by substantially parallel busing conductors, at least some of the rows defined by a single busing conductor, wherein consecutive rows of single busing conductors are of alternating polarity; and adjusting the positions of the standard cells to fit as closely as possible to standard cells in adjacent parallel rows along edges of the minimum boundaries surrounding each cell, wherein at least one of the standard cells in at least one of the substantially parallel rows has a different height than that of another standard cell in that same substantially parallel row.

2. The computer implemented method of claim 1 wherein each of busing conductor provides power to at least one of the substantially parallel rows of the standard cells.

3. A computer implemented method for positioning standard cells on a semiconductor substrate comprising the steps of:

(a) determining a minimum boundary surrounding each standard cell to which circuit devices may approach without significantly disturbing the operation characteristics of the standard cell;

(b) positioning the standard cells in substantially parallel rows on the semiconductor substrate as defined by substantially parallel busing conductors, at least some of the rows defined by a single busing conductor, wherein consecutive rows of single busing conductors are of alternating polarity, the substantially parallel rows being in a first direction, the standard cells in each of the substantially parallel rows optionally having different heights in a second direction which is approximately perpendicular to the first direction; and (c) adjusting the positions of the standard cells to fit as closely as possible to standard cells in adjacent parallel rows along edges of the minimum boundaries surrounding each cell.

4. The computer implemented method of claim 3 wherein at least one standard cell of one of the substantially parallel rows has a different height in the second direction than another standard cell of the same substantially parallel row.

5. The computer implemented method of claim 3 wherein each busing conductor provides power to at least one of the substantially parallel rows of the standard cells.

6. A computer implemented method for positioning standard cells on a semiconductor substrate comprising the steps of:

(a) determining a minimum boundary surrounding each standard cell to which circuit devices may approach without significantly disturbing the operation characteristics of the standard cell;

(b) positioning the standard cells in substantially parallel rows on the semiconductor substrate as defined by substantially parallel busing conductors, at least some of the rows defined by a single busing conductor, wherein consecutive rows of single busing conductors are of alternating polarity, the substantially parallel rows being in a first direction, each of the standard cells in each of the substantially parallel rows having a height in a second direction which is approximately perpendicular to the first direction, at least one standard cell in at least one of the substantially parallel rows having a different height than that of another standard cell in that same substantially parallel row; and (c) adjusting the positions of the standard cells to fit as closely as possible to standard cells in adjacent parallel rows along edges of the minimum boundaries surrounding each cell.

7. The computer implemented method of claim 6 wherein busing conductor provides power to at least one of the substantially parallel rows of the standard cells.

8. A method for positioning standard cells on a semiconductor substrate comprising the steps of:

(a) determining a minimum boundary surrounding each standard cell to which circuit devices may approach while maintaining the electrical integrity of the standard cell;

(b) positioning the standard cells in substantially parallel rows on the semiconductor substrate as defined by substantially parallel busing conductors, at least some of the rows defined by a single busing conductor, wherein consecutive rows of single busing conductors are of alternating polarity, the substantially parallel rows being in a first direction, each of the standard cells in each of the substantially parallel rows having a height in a second direction which is approximately perpendicular to the first direction, at least one standard cell in at least one of the substantially parallel rows having a different height than that of another standard cell in that same substantially parallel row; and (c) adjusting the positions of the standard cells to fit as closely as possible to standard cells in adjacent parallel rows along edges of the minimum boundaries surrounding each cell.

* * * * *